United States Patent [19]

Carlson et al.

[11] 4,427,457

[45] Jan. 24, 1984

[54] METHOD OF MAKING DEPTHWISE-ORIENTED INTEGRATED CIRCUIT CAPACITORS

[75] Inventors: F. Paul Carlson; John S. Blakemore, both of Portland; Nicholas G. Eror, Banks, all of Oreg.

[73] Assignee: Oregon Graduate Center, Beaverton, Oreg.

[21] Appl. No.: 251,756

[22] Filed: Apr. 7, 1981

[51] Int. Cl.³ .................... H01L 29/78; H01L 29/80
[52] U.S. Cl. ........................................ 148/1.5; 29/571; 29/576 B; 148/187; 357/14; 357/22; 357/51; 357/91
[58] Field of Search ................... 148/1.5, 187; 29/571, 29/576 B; 357/22, 51, 14, 91

[56] References Cited

U.S. PATENT DOCUMENTS

| | | |
|---|---|---|
| 2,717,343 | 9/1955 | Hall . |
| 2,753,496 | 7/1956 | Teszner . |
| 3,171,068 | 2/1965 | Denkewalter et al. . |
| 3,258,723 | 6/1966 | Osafune et al. . |
| 3,434,015 | 3/1969 | Kilby . |
| 3,460,010 | 8/1969 | Domenico et al. . |
| 3,653,977 | 4/1972 | Gale ..................................... 148/1.5 |
| 3,657,609 | 4/1972 | Oswald et al. . |
| 3,681,220 | 8/1972 | Chizinsky ............................... 29/571 |
| 3,893,147 | 7/1975 | Williams et al. ....................... 357/14 |
| 3,898,105 | 8/1975 | Mai et al. . |
| 3,906,539 | 9/1975 | Sauermann et al. ................... 357/14 |
| 3,925,803 | 12/1975 | Kobayashi ............................ 357/14 |
| 3,962,713 | 6/1976 | Kendall et al. . |
| 4,017,885 | 4/1977 | Kendall et al. . |
| 4,179,311 | 12/1979 | Athanas . |
| 4,216,029 | 8/1980 | Ohki ..................................... 148/1.5 |

OTHER PUBLICATIONS

"Electronic Circuits: Discrete and Integrated," D. L. Schilling, Charles Belove, McGraw-Hill Book Company, 1968, pp. 331-337.
"MOS Integrated Circuits," W. M. Penney; Lillian Lau, Van Nostrand Reinhold Company, 1972, pp. 53-55.
"Ion-Implanted Semiconductor Devices," D. H. Lee; James W. Mayer, Proc. IEEE, vol. 62, No. 9, pp. 1241-1255, Sep. 1974.
"Channelling and Dechannelling of Ion-Implanted Phosphorus in Silicon," V. G. K. Reddi; J. D. Sansbury, J. Appl. Phys., vol. 44, No. 7, Jul. 1973, pp. 2951-2963.
"Ion Implantation of Semiconductors," G. Carter; W. A. Grant, Arnold, 1976, Chapters 3, 4 and 7.

Primary Examiner—Upendra Roy
Attorney, Agent, or Firm—Klarquist, Sparkman, Campbell, Leigh & Whinston

[57] ABSTRACT

A depthwise-oriented capacitor comprises a cluster of separate, parallel, narrow elongated oppositely-doped conductive regions extending depthwise into a semiconductor substrate, for example, in an integrated circuit. The conductive regions can be parallel plates, but are preferably column shaped. The conductive regions are formed by ion implanting or diffusing a dopant into the substrate in a direction aligned with a crystallographic channel thereof to facilitate maximum ion penetration. P-type regions form one pole of the capacitor and N-type regions interspersed among the p-type regions form the opposite pole. Doping concentrations within the regions are sufficient to establish metal-like electric field boundary conditions. The bulk of the substrate containing the conductive regions is either near-intrinsic or semi-insulative so that the semiconductor material between the conductive regions is substantially nonconductive. The oppositely-doped regions are spaced closely enough together that the intervening nonconductive region is depleted of free carriers over the operational voltage range of the capacitor but sufficently separated that the depleted breakdown voltage of the nonconductive region is not exceeded. The conductive regions are arranged in a regular geometrical pattern, for example, at the vertices of a hexagonal or square honeycomb pattern, so that the nearest neighbors of each conductive region of one dopant type are of the opposite dopant type. Surface conductors interconnect at least the conductive regions of one dopant type while the oppositely-doped conductive regions are interconnected either by surface conductors or by doped conductors in the bulk of the substrate. The surface conductors are link-trimmable to vary capacitance incrementally after fabrication. Changes in capacitance values can be effected during manufacture without mask alterations by controlling the depth of penetration of the conductive regions.

18 Claims, 21 Drawing Figures

FIG. 1
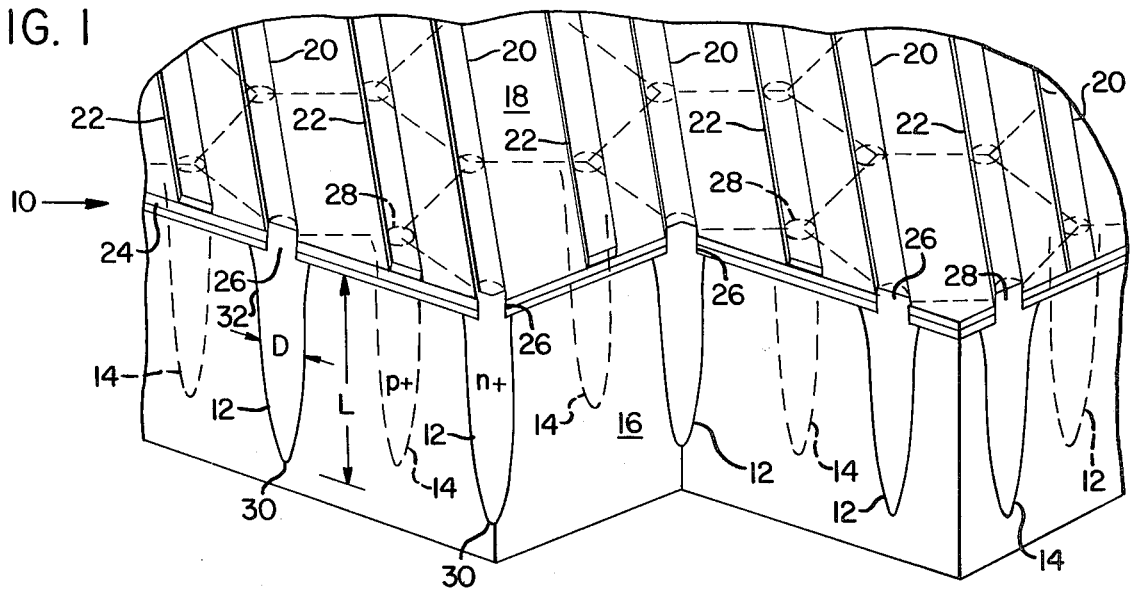
FIG. 2
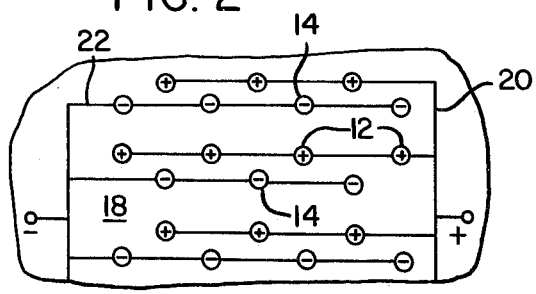
FIG. 3
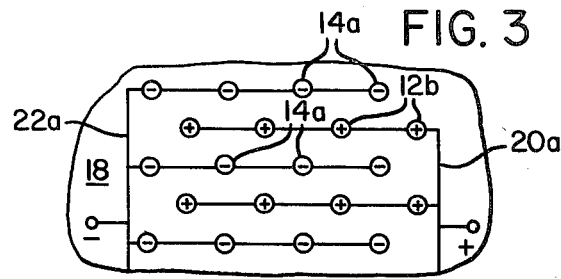
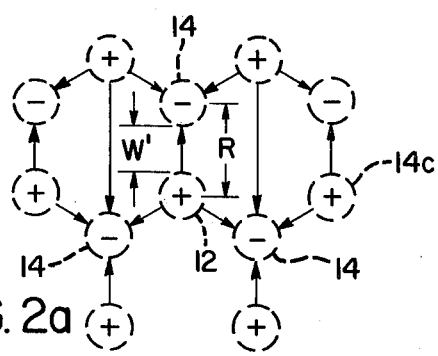
FIG. 2a
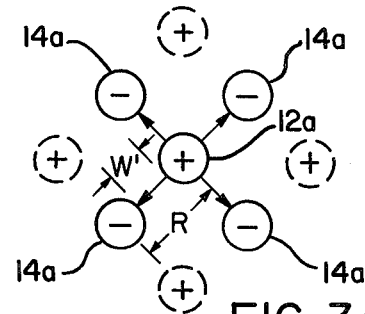
FIG. 3a
FIG. 4
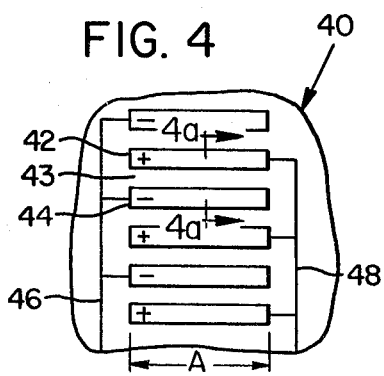
FIG. 4a
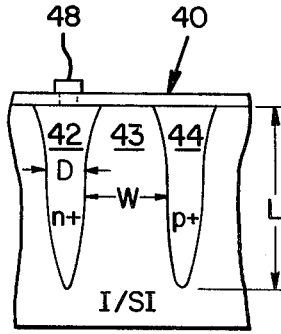
FIG. 5
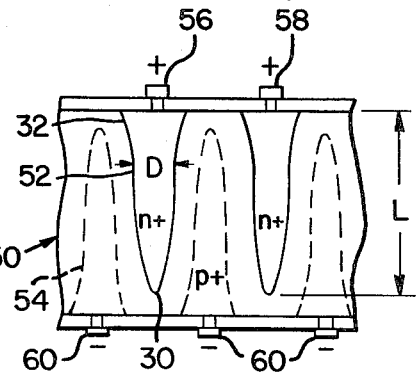

METHOD OF MAKING DEPTHWISE-ORIENTED INTEGRATED CIRCUIT CAPACITORS

BACKGROUND OF THE INVENTION

This invention relates generally to capacitors and more specifically to capacitors formed in semiconductors, for example, in large scale integrated circuits.

A persistent problem in the design of integrated circuits relates to the economical incorporation of capacitor elements within the integrated circuit structure. It is difficult to provide sufficently large value capacitors on an integrated circuit chip as would avoid the need for discrete capacitors off the chip.

Several kinds of capacitors are used in integrated circuits and essentially, each kind relies on the conventional concept of parallel-plate geometry. The first kind is a junction capacitor formed from the collector and base terminals of an ordinary transistor. The second kind is a thin film capacitor. The latter is constructed along the surface of a semiconductor substrate by first diffusing an n-doped region and then an n+ doped region into a p-type substrate. Next, a thin layer of dielectric material, usually silicon dioxide, is applied, followed by metallic film or layer, usually of aluminum. Examples of these capacitors are disclosed in Schilling, et al., "Electronic Circuits: Discrete and Integrated," pages 331–337 (1968).

Metal-oxide-semiconductor (MOS) capacitors are formed by oxidizing a thin surface layer of a doped semiconductor substrate and applying a metal or other conductive layer to the surface of the oxide. Conventional MOS capacitors are shown in U.S. Pat. No. 3,434,015 to Kilby and in Penney, et al., "MOS Integrated Circuits," pages 53–55 (1972).

Although differing in some respects, the foregoing capacitors have a common characteristic: each employs substrate surface-oriented, parallel conductive plates separated by a dielectric layer whose thickness is normal to the substrate surface. Larger capacitance values are obtained in such capacitors either by increasing the area A of the parallel plates, by decreasing the distance d between the conductive layers, or by increasing the permittivity $\epsilon$ of the dielectric layer between the conductive layers, in accordance with the formula $C = A\epsilon/d$.

Several problems arise in applying these techniques. First, the ability to control permittivity $\epsilon$ is limited to a narrow range of materials compatible with integrated circuit technology. Second, the ability to reduce the distance, d, between the conductors is limited by the thickness of the dielectric layer. If the oxide or other dielectric film is too thin, it is subject to voltage breakdown, resulting in permanent damage to the device. This problem is even greater if the capacitor is p-doped because of the tendency of pinholes to form in oxide layers thermally-grown on p-type semiconductor materials. Consequently, the lower practical limit of oxide-layer thickness in commercial production integrated circuits is about 0.6 $\mu$m, although effective oxide layers of lesser thickness have been produced experimentally.

A third problem is that increasing the area, A, of the parallel plates of conventional capacitors consumes valuable surface area of the substrate. This area could otherwise be used for other circuit components. Much of the bulk of the substrate remains unused since circuit components in large scale integrated circuits typically extend less than 1.0 $\mu$m below the substrate surface. Simply increasing the depth of surface-oriented capacitors does not increase their capacitance. Hence, conventional techniques of forming integrated circuit capacitors interfere with one of the principal objectives of integrated circuit design—maximizing component packing on a semiconductor chip. Substantial experimentation has been conducted into ion-implantation of semiconductor devices, including the depthwise doping profiles that can be obtained using various implantation techniques. This experimentation is reviewed by D. H. Lee, et al. in "Ion-Implanted Semiconductor Devices," Proc. IEEE, Vol. 62, No. 9, pp. 1241–1255, Sept. 1974, and by V. G. K. Reddi, et al. in "Channeling and dechanneling of ion-implanted phosphorous in silicon," J. Appl. Phys., Vol. 44, No. 7, pp. 2951–2963, July 1973. However, these efforts have been primarily directed to minimizing the depth of ion penetration in constructing transistors rather than maximizing space utilization by capacitors in integrated circuits as disclosed in U.S. Pat. No. 3,653,977 to Gale.

Another problem in making semiconductor capacitors relates to the difficulty of controlling their dimensions and thereby precisely determining their capacitance. The conductive layers are difficult to trim to a desired size and yet consistently obtain smooth, aligned boundaries. Jagged or misaligned boundaries introduce unpredictable fringing effects into the electric field between the conductors. As a result, precision capacitance values can be very difficult to obtain using conventional trimming techniques.

A further problem is voltage-dependency of capacitance values in most types of semiconductor capacitors. Charging such capacitors causes a depletion layer to form in the semiconductor material along the junction or semiconductor oxide layer boundary. The depletion layer acts as a dielectric and increases the effective distance, d, between the conductors, thereby reducing the capacitance of the device. In many integrated circuit designs, this variation can be nearly as great as the gross capacitance of the device. Manipulating biasing in the circuit to control such extreme capacitance variation can impose difficult design constraints on the circuit designer.

Several variations in semiconductor capacitor designs have been tried in an attempt to increase capacitance values. However, these efforts focus primarily on increasing the area of essentially parallel-plate-type conductors. U.S. Pat. No. 3,171,068 to Denkewalter, et al. discloses a semiconductor capacitor comprising concentric hexagonal layers of alternate p-type and n-type material. U.S. Pat. No. 3,460,010 to Domenico, et al. discloses a decoupling capacitor formed on the underside of an integrated circuit chip and employing alternating columns of p-type and n-type material and a metal layer underlying the entire chip. The p-type material is insulated from the metal plate by a thin dielectric film. U.S. Pat. Nos. 3,962,713 and 4,017,885 to Kendall, et al. disclose capacitors formed by selectively etching channels into the semiconductor substrate, forming a thin layer of dielectric over the resultant increased surface area and thereafter forming a metal layer over the dielectric layer. The result is a parallel-plate capacitor having an accordion-like shape.

None of the foregoing patents attempt to increase capacitance by decreasing the distance, d, between oppositely-charged conductors. In the Denkewalter, et al. and Domenico, et al. devices, this distance is determined almost entirely by the dimensions of the depletion layer at the p-n interfaces of the layers. In the Kendall, et al. capacitor, distance d is determined by the thickness of the insulative film separating the conductors. The capacitance values obtained in the foregoing devices are strongly influenced by the voltage-dependent depletion layers in the semiconductors. Also, the Kendall, et al. capacitors are likely to be rather fragile due to the deep etching of the substrate to increase the area of the capacitor.

Accordingly, there remains a need for improved forms of capacitors, and particularly for improved capacitors and capacitor-making techniques applicable to the design and construction of integrated circuits.

SUMMARY OF THE INVENTION

One object of the invention is to increase effective capacitance values in integrated circuits in proportion to substrate surface area.

A second object is to provide a form of capacitor which is compatible with the continued miniaturization of integrated circuits.

Another object of the invention is to utilize the bulk of a semiconductor substrate to form capacitors without disrupting its physical continuity.

A further object of the invention is to enable integrated circuit capacitors to be made with a smaller dielectric thickness, d, than is possible with conventional thin film capacitor construction.

Yet another object is to make the distance d between conductors of semiconductor capacitors independent of the thickness of surface oxide or other surface dielectric layers.

An additional object is to reduce or, preferably, eliminate voltage dependency of capacitance values in semiconductor capacitors.

Another object is to enable precision capacitors to be formed in integrated circuits.

A further object is to make link-trimmable capacitors. A related object is to provide a range of possible capacitance values within a substrate surface region of a given area.

Yet another object is to make capacitors as aforedescribed using techniques compatible with conventional integrated circuit manufacturing methods.

An additional object is to make integrated circuit capacitors as aforedescribed by a simple process which is adaptable to a wide variety of integrated circuit designs and manufacturing methods.

A capacitor in accordance with the invention comprises narrow elongated conductive regions extending depthwise into the bulk of a substrate with adjacent such regions being connected to opposite polarity conductors. Such capacitors can be formed in semiconductor substrates by oppositely doping very small, spaced-apart, adjacent surface areas of the substrate to a substantial depth to form the conductive regions. This is preferably accomplished by ion implantation in alignment with an open crystallographic channel of the substrate.

In one embodiment, the bulk of a substrate is "near intrinsic," that is, lightly doped with one type dopant, for example, p-type ions. Small surface areas are heavily doped with the same type dopant to form a first set of spaced-apart conductive regions. Different small surface areas of the substrate are then heavily doped with an opposite-type dopant, for example, n-type ions, to form a second set of conductive regions spaced between the regions of the first set. Doping concentrations are sufficient to establish a metal-like conductive boundary condition defining the conductive regions. Distance d between the oppositely-doped conductive regions is thus limited to the spacing between the conductive regions as formed. This distance is less than the thickness of the depletion layer which would form about a reverse-biased p-n junction between such materials. Consequently, when the capacitor is charged to a voltage range somewhat below the breakdown voltage of the material between such regions, capacitance is voltage independent.

In a second embodiment, the bulk of the substrate is selectively doped with one dopant to form a surface pattern of "islands" of undoped substrate surrounded by a contiguous sea of conductive material. The centers of the islands are then heavily implanted with an opposite dopant to render them conductive. The undoped peripheries of the islands insulate the conductive regions from one another. This embodiment is advantageous in that a single surface conductor suffices to interconnect the conductive islands, the opposite polarity conductive region being interconnected with the bulk of the substrate.

As an alternative to near-intrinsic semiconductive materials, such as silicon (Si), the substrates can be semi-insulative, for example, gallium (Ga) or indium (In) compounds. In addition, the substrate materials can be polycrystalline as well as monocrystalline.

Using these techniques, it is possible to form parallel-plate capacitors comprising closely spaced-apart plates of alternating doping and polarity extending downwardly into a near-intrinsic semiconductor or a semi-insulative substrate. However, it is preferable that the conductive regions of at least one polarity of the capacitor have a generally columnar shape. To make optimum use of the bulk of the substrate, the invention provides that these columns be arranged in a tightly-packed array or cluster For ease of manufacture, this array should also have a geometrical regularity. In one preferred embodiment meeting these criteria, the columns are positioned at vertices of a hexagonal honeycomb pattern. In another embodiment, the columns are positioned at vertices of a square grid pattern. Within an array of opposite-polarity columns, each column is connected to one or another of two surface conductors. A column connected to one conductor has, as its nearest neighbors, three or more oppositely-doped columns connected to the other conductor. Like-polarity columns can also be electrically interconnected within the substrate to isolate the remaining opposite polarity columns which are electrically interconnected along the substrate surface.

The surface conductors can be either metal or heavily-doped polycrystalline material. As a result, capacitance values can be altered simply by cutting links in the surface conductors using conventional resistance trimming techniques. Capacitance values can also be changed without trimming or altering the masks used in constructing the circuit simply by controlling the depth of the conductive regions.

Another advantage is that the spacing between opposite-polarity conductive regions can be reduced independently of the ability to form high-integrity oxide layers. For a given operational voltage range, the minimum spacing is determined by the breakdown voltage of the selected substrate. Hence, the only practical limits on miniaturization of integrated circuit capacitors are masking techniques and the constraints of low voltage operation. The doping type of the opposite-polarity regions can be interchanged along with their polarity. Hence, the methods employed in making capacitors in accordance with the invention are compatible with either n-channel or p-channel design techniques.

The foregoing and other objects, features and advantages of the present invention will become more readily apparent from the following detailed description of several preferred embodiments, which proceeds with reference to the following drawings.

BRIEF DESCRIPTION OF THE DRAWINGS

FIG. 1 is a top perspective view of one embodiment of an integrated circuit capacitor according to the invention with sections cut away to show internal structure, the dashed surface pattern indicating the positions of column-shaped conductive regions at the vertices of a hexagonal honeycomb.

FIG. 2 is a diagram showing a top plan view of a portion of the capacitor of FIG. 1, and FIG. 2a is an enlargement of part of FIG. 2 showing the field relationships and spacings between opposite polarity columns.

FIGS. 3 and 3a are views corresponding to the views of FIGS. 2 and 2a, respectively, showing a variation of the capacitor of FIG. 1 in which the columnar conductive regions are positioned at the vertices of a square grid.

FIG. 4 is a top plan view of a second embodiment of a capacitor in accordance with the invention showing spaced-apart, oppositely-doped parallel-plate conductive regions extending downwardly into a nonconductive substrate region of either near-intrinsic semiconductor (I) or semi-insulative (SI) material.

FIG. 4a is a cross-sectional view taken along line 4a—4a in FIG. 4.

FIG. 5 is a cross-sectional view of another variation of the capacitors of FIGS. 1-4 showing opposite polarity conductive regions extending depthwise into a substrate region at alternating positions from opposite surfaces of the substrate.

DETAILED DESCRIPTION OF PREFERRED EMBODIMENTS

Figure 6:
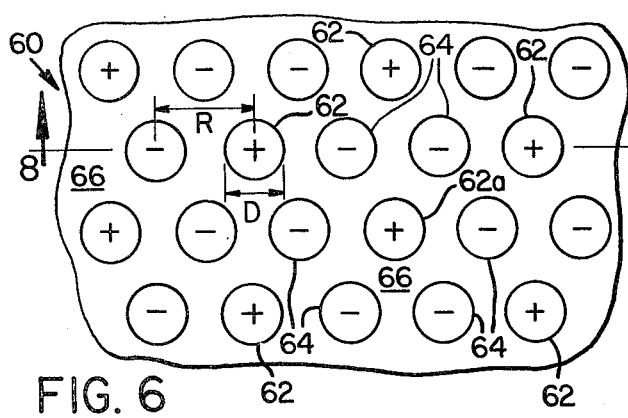
FIG. 6 is a top plan view of a third form of capacitor in accordance with the invention showing positive polarity columns arranged in a large hexagonal grid with each such column surrounded by six columns of negative polarity arranged in a small hexagonal grid.

The various features of capacitors in accordance with the invention are described in the following subsections. Thereafter, two alternative methods of making such capacitors are described.

Overall Construction

Referring to FIG. 1, a capacitor 10 in accordance with the invention comprises a cluster of spaced-apart, elongated conductive regions 12, 14 extending depthwise into a substrate 16. The conductive regions are interconnected in alternate rows on the substrate's upper surface 18 by two sets of conductors 20, 22. The conductors are metal, such as aluminum, or, preferably, heavily-doped polycrystalline silicon. An insulative layer 24 covers the surface of the substrate. Conductor contacts 26, 28 extend through the insulative layer to the surface of the substrate to electrically connect the opposite polarity regions and the conductors 20, 22, respectively. As will become more readily apparent hereinafter, many of these features can be varied within the scope of the invention.

Substrate Characteristics

Substrate 16 is made of a suitable conventional semiconductor material, preferably a monocrystalline silicon (Si) wafer. However, polycrystalline silicon, silicon on sapphire, or other semiconductor substrate materials can be used as well. As discussed in greater detail hereinafter, the silicon substrate must be "near-intrinsic" in its doping concentrations. Accordingly, substrate 16 is lightly doped with an n-type dopant, such as phosphorus to a carrier concentration of $N_d \approx 10^{15}$ cm$^{-3}$ (conventionally shown as "n— —" in FIGS. 8–10) to $10^{16}$ cm$^{-3}$ (conventionally "n—"). In silicon at 300° K., such a carrier concentration will provide a resistivity of about 1 to 5 ohm-cm.

Alternatively, a dielectric or semi-insulative (S-I) substrate material, such as gallium arsenide or indium phosphide can be used for certain applications. In this case, carrier concentrations need not be near-intrinsic.

In the preferred embodiment, the wafer is cut in such a way that an open crystallographic channel (such as the <110> channel in silicon) extends downwardly into the bulk of the wafer from surface 18, which can be referred to as a reference surface. The characteristics of such channels are described in Carter, et al., "Ion Implantation of Semiconductors," Chapters 3 and 4 (1976). The techniques of cutting such wafers to obtain depthwise-extending open channels are known to those skilled in the art.

It is not necessary that the selected channel be perpendicular to the reference surface. Such wafers are conventionally cut so that any open channels are positioned at a small angle, for example 8°, from the perpendicular. This is done to minimize penetration of ions implanted to form active circuit devices along the surface of conventional integrated circuits, as specifically described on page 197 of Carter, et al. If this procedure is followed, the method of making capacitor 10 is altered slightly, as discussed hereinafter, to obtain the desired depth of ion implantation to form conductive regions 12, 14. Hence, the conductive regions are not necessarily normal to the reference surface.

Characteristics of Conductive Regions

Regions 12, 14 are structurally integrated into the crystalline lattice of the substrate 16. Physically, the conductive regions appear as a cloud of dopant ions extending downwardly into the substrate. In transverse section, the cloud is characterized by an axially-symmetrical gaussian concentration distribution. This distribution is preferably steeply graded to provide a fairly distinct conductive boundary condition. This boundary condition appears in vertical cross section as a vertically-oriented gaussian curve, the regions being rounded at their lower ends 30 and slightly flared at their upper ends 32 due to dechanneling effects during implantation. However, for analytic purposes, such regions can be viewed as conductive columns having a diameter D over most of their length L.

Regions 12, 14 are doped heavily enough to provide adequate excess carrier population to render such materials conductive. Within the volume of such columns, the carrier concentration is sufficiently large that no appreciable electric field penetrates them. A resistivity of less than $10^{-1}$ ohm-cm is sufficient for this purpose. For n-doped regions 12, a concentration $N_d \simeq 10^{17}$ to $10^{18}$ cm$^{-3}$ ("n+" in FIGS. 8-10) provides a resistivity of less than $10^{-1}$ ohm-cm.

Heavier concentrations, for example, $N_d \simeq 10^{20}$ to $10^{21}$ cm$^{-3}$ ("n++") will further reduce resistivity, which is desirable but must be used cautiously. Increased implantation concentrations can increase the number of crystalline lattice defects in the wafer to the point that the substrate material fails. Annealing can be used to cure lattice defects to some extent, as discussed in Lee, et al., "Ion-Implanted Semiconductor Devices" Proc. IEEE, Vol. 62, No. 9, Sept. 1974, pp. 1241–1255. However, broadening of the implanted ion distribution due to diffusion generally occurs at anneal temperatures of 900-1000° C. Preferably, the implant profiles of regions 12, 14 present a distinct conductive boundary. Hence, annealing at high enough temperatures to cause significant diffusion should be avoided.

Regions 14 are oppositely doped with a p-type dopant, such as boron, in heavy enough concentrations to render such regions conductive. Carrier mobility in p-doped silicon is somewhat less than in that of n-doped silicon. Accordingly, to obtain comparable resistivity to the n-doped regions, somewhat higher concentrations of p-type dopants are needed. Concentrations $N_a > 5 \times 10^{17}$ will provide a resistivity less than $10^{-1}$ ohm-cm. In regions 14, p-dopant concentrations of $N_a \simeq 10^{18}$ or slightly higher (shown as "p+" in FIGS. 8-10) are preferred. Heavier p-type doping concentrations can also be used, within the limitations described above relating to the lattice defects and annealing.

The dimensions and spacing of the conductive regions are variable, depending upon a number of physical and operational parameters and upon the techniques used in forming the regions.

Depth of Conductive Regions

The length L of the conductive regions is limited, first, by the thickness of the substrate in which they are formed and, second, by the depth to which ions can be implanted into the substrate material. Another limitation is the ability to obtain a fairly constant dopant concentration profile over the length of the conductive regions. Using a method described hereinafter, the optimum length L of regions 12, 14 is in the range of 1.0 to 2.5 $\mu$m in monocrystalline silicon. A relatively uniformly doping concentration profile is obtained in this range by multiple-dose-energy ion implantations. Lesser lengths can be used if desired, but needlessly sacrifice chip area to form the capacitors. Greater lengths can also be obtained, for example, 3.5 $\mu$m in <110> orientation silicon. However, much higher ion implantation energies are required, for example, 900 kev to implant phosphorus ion to a depth of 3.5 $\mu$m versus 450 kev to implant to a depth of about 2 $\mu$m.

Once the length of the conductive regions is established, the capacitance obtainable in a given surface area of semiconductor substrate depends upon the spacing between regions of opposite polarity. That determination, in turn, depends on the geometrical arrangement of regions 12, 14 and on the dielectric and conductive qualities of the intervening medium. Columnar regions 12, 14 preferably have a circular cross section of diameter D, although other cross-sectional shapes could be used.

Geometries of Conductive Regions

Referring to FIG. 4, the simplest integrated circuit capacitors according to the invention are formed of multiple, oppositely-doped, parallel-plate type conductive regions 42, 44 extending depthwise into substrate 40 from the surface thereof. Such regions are separated by intervening layers 43 of substrate material. Regions 42 are connected to one polarity conductor 46. The intervening opposite polarity regions 44 are connected to an opposite polarity conductor 48. In this capacitor the electric field is essentially one-dimensional.

The following preferred geometries all are more complex in that they provide a two-dimensional field around each conductive region and a greater number of interconnections than the parallel plate capacitor provides. In FIGS. 1, 2, and 2a, each column of one polarity, for example, region 12, has as its nearest neighbors three columns 14 of opposite polarity spaced equidistantly apart around region 12. The resultant array is hexagonal. Similarly, in FIGS. 3 and 3a, a column 12a of one polarity has four nearest neighbors 14a of opposite polarity. Columns 14a are spaced equidistantly apart from column 12 and angularly spaced apart around column 12. The resultant array is rectangular.

The foregoing geometrical arrangements have in common a regularity which is repetitive for each column and provides equal numbers of columns of each polarity. These features appear advantageous in terms of distribution of an electric field between the columns of opposite polarity. They also enable masks of identical geometrical patterns, slightly offset from one another, to be used for producing the oppositely-doped columns.

An alternative form of semiconductor capacitor 50 is shown in FIG. 5. Conductive regions 52, 54 extend into the substrate region containing the capacitor from opposite sides of the substrate. This arrangement enables the conductors of one polarity and doping to be interconnected by surface conductors 56 on one side of the substrate while the conductors of opposite polarity and doping are interconnected by surface conductors 60 on the opposite side of the substrate. The conductive regions 52, 54 can be columns arranged in either of the geometrical patterns shown in FIGS. 2 or 3, or in the patterns of FIGS. 6 and 7, described hereinafter. Alternatively, conductive regions 52, 54 can take the form of parallel plates, as shown in FIG. 4. The FIG. 5 embodiment enables the conductors to be spaced uniformly apart up on their respective surfaces. They can also be spaced further apart than is possible when both polarity conductors are formed on one surface of the substrate, eliminating the possibility of shorting or bridging between opposite-polarity conductors.

Figure 7:
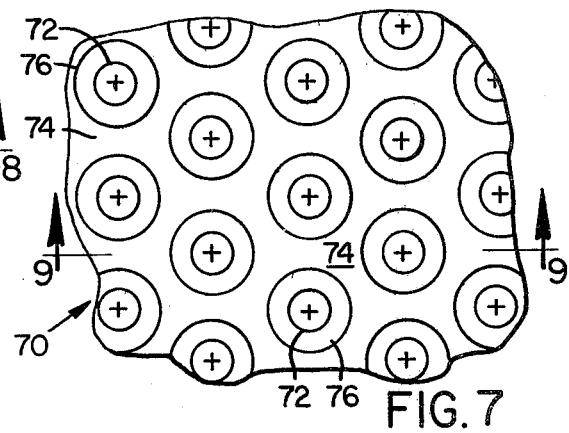
FIG. 7 is a top plan view of a variation of the capacitor of FIG. 6 showing continuous honeycomb-like negative-polarity conductive region surrounding positive-polarity columns inside nonconductive islands.

The geometrical patterns of FIGS. 6 and 7 provide the potential for somewhat greater packing density than the arrangements of FIGS. 2 and 3. In capacitor 60 of FIG. 6, each column 62 of one polarity has as its nearest neighbor six columns 64 of opposite polarity spaced apart within the bulk of substrate 66. Columns 62 collectively form a large hexagonal pattern surrounding a like polarity column 62a. Each set of columns 64 surrounding a column 62 forms a small hexagonal pattern. Columns 64 outnumber columns 62 by a ratio of two to one.

The geometrical arrangement in capacitor 70 of FIG. 7 resembles that of FIG. 6 in that the positive polarity columns 72 are arranged in a large hexagonal pattern. However, the opposite polarity columns 14b of FIG. 6 are interconnected in the substrate of FIG. 7 to form a continuous conductive region 74 isolating columns 72 from one another. In addition, columns 72 are concentrically surrounded by annular insulative regions 76.

Substantial flexibility in changing capacitance values, once the surface geometry of such capacitors is established, is obtained by controlling the depth of the conductive regions during manufacture. Moreover, after fabrication, capacitance values can be reduced by trimming the polycrystalline surface conductor links utilizing conventional resistor trimming techniques. This capability is particularly advantageous in analog and hybrid integrated circuits. However, maximum capacitance values obtainable per unit surface area are ultimately determined by the spacing between opposite-polarity conductive regions.

Conductive Region Spacing

For a given capacitor geometry, the minimum spacing between conductive regions is limited, in practice, by photolithographic and implant resolution and by metallization and isolation problems. Once these problems are solved, the ultimate limiting factor is the maximum electric field between adjacent columns of opposite polarity.

As mentioned above, the opposite polarity conductive regions must also be oppositely doped. If a potential is applied between two like-doped regions separated by a lightly doped or even by a very nearly intrinsic insulative region in a semiconductor capacitor, such as region 43 in the parallel plate capacitor of FIG. 4, carriers will be injected through the insulative region, causing an electrical short between the opposite polarity plates. Accordingly, the capacitors of the invention must be formed of oppositely-doped, reverse-biased conductive regions 42, 44 separated by an insulative region 43. Depending on whether the intervening substrate region 43 is near intrinsic (I) or semi-insulative (SI), the capacitor is referred to as having either a p-I-n or a p-SI-n structure. For reasons which will become more readily apparent hereinafter, the p-I-n/p-SI-n structure is far superior to the p-n junction capacitor structure.

The following analysis is carried out with reference to the one dimensional capacitor of FIG. 4, but is applicable as well to the two dimensional fields present in the geometrical arrangements of FIG. 1-3, 6 and 7. For purposes of comparison, it is useful to first consider the model for a parallel plate p-n junction capacitor (not shown). Applying this model to FIG. 4, plates 42 are heavily doped n+ regions implanted into a weakly-doped p-type substrate ($N_a \simeq 10^{15}$ cm$^{-3}$). Regions 44 are heavily doped with p-type impurities and, together with the substrate, forms the p side of the junction. Doping in this manner provides a rather abrupt asymmetric p-n+ junction (not shown) enveloping the n+ regions 42 and, in particular, passing through region 43. With no external voltage V applied, a depletion layer or region, represented as region 43, develops about the junction as a result of the field due to the built-in voltage $V_B$ associated with the junction between the p− and n+ regions 42, 44. Applying a reverse-biased voltage V across regions 42, 44 increases the width $W_v$ of the depletion region in accordance with $$W_v = [2k\epsilon_0(V+V_\beta)/eN_a]^{\frac{1}{2}} \tag{1}$$

where k is the dielectric constant, $\epsilon_o$ is the permittivity of free space and e is the electronic charge. The capacitance per unit area of the p-n junction is:

$$C = \frac{k\epsilon_0}{W_v} = [ek\epsilon_0 N_a/2(V+V_\beta)]^{\frac{1}{2}}. \tag{2}$$

The maximum field strength across the junction is:

$$E_{max} = \frac{2(V+V_\beta)}{W_v} = [2eN_a(V+V_\beta)/k\epsilon_0]^{\frac{1}{2}} \tag{3}$$

For a lightly-doped p-type silicon ($N_a \simeq 10^{15}$ cm$^{-3}$) resistivity is approximately 15 ohm-cm. Assuming that the capacitor will be operated in the range of $V+V_\beta \simeq 3$ volts, then the depletion layer width $W_v \simeq 2$ μm, the field $E_{max} \simeq 3 \times 10^4$ volt/cm. and its capacitance $C \simeq 5 \times 10^{-5}$ pF/μm$^2$. The maximum field is substantially below the breakdown limits of the substrate, but width $W_v$ is much larger than is desired for highly compact microcircuits. Capacitance C is correspondingly small, and varies as $(V+V_\beta)^{-\frac{1}{2}}$.

Hence, a p-n junction capacitor does not take adequate advantage of the capacitor geometries provided by the present invention. As noted above, the foregoing formulae apply to one-dimensional, parallel-plate geometry capacitors. Around a columnar implanted region, such relationships will be true only if width $W_v$ is less than the radius R between opposite polarity regions 12, 14 in FIG. 2a. This would require that the center-to-center spacings of the opposite polarity columns be greater than the depletion layer width, that is, $R > W_v \simeq 2$ μm, if the depletion layer is relied on to insulate the conductive regions from one another. To take full advantage of the capacitor geometries of the invention, it is necessary to utilize either a reversed-biased p-I-n junction or a reverse biased p-SI-n junction. As will become more readily apparent hereinafter, these devices can include p+-n and p-n+asymetrical junctions under certain conditions.

Reverse Biased P+-I-N+ Junction

The behavior of a p-I-n structure has previously been analyzed for the complexities of its forward current voltage characteristic and also for its ability to withstand a large peak inverse voltage when a wide separation is provided between the p-type and n-type regions. The p-I-n structure is incorporated in the capacitor of FIG. 4 by heavily doping regions 42 with n-type dopant and heavily doping regions 44 with p-type dopant. The conductive regions 42, 44 have an approximately uniform thickness D along their lengths and from one conductive region to the next. The "near-intrinsic" substrate, including regions 43 separating regions 42, 44, is lightly doped with either n-type (n— —to n—) or p-type (p— —to p—) dopants.

The spacing between the opposite polarity plates of the capacitor is a very narrow width W of region 43 between the oppositely charged regions 42, 44, best seen in FIG. 4a. Providing a relatively close spacing between the oppositely-doped regions and reverse biasing the heavily doped regions results in total depletion of the lightly doped region 43. Width W is a constant when the lightly-doped region 43 is totally depleted of free carriers.

Accordingly, the electric field $E_{max}$ and capacitance C stated in equations 2 and 3 are constants which are independent of the doping in region 43 provided that the doping concentration, for example, $N_a$, satisfies the inequality:

$$N_a < 2k\epsilon_0(V+V_\beta)/eW^2 \quad (4)$$

Under this condition, the depletion regions from the n+ and p+ regions 42, 44 overlap. In other words, the spacing between the conductive boundaries of the oppositely-doped regions is less than the width of the depletion layer that would normally exist between such regions at normal operating voltages. It now remains to determine the minimum practical spacing between the conductive regions in the parallel plate capacitor of FIGS. 4 and 4a.

For weakly-doped silicon ($N_a > 10^{15}$) the avalanche breakdown field $E_{br} \approx 2 \times 10^5$ volt/cm. Accordingly, from equation (3), for an operational capacitor voltage $V+V_\beta \approx 3$ volts, the width W of region 43 must be at least 0.15 μm.

For an array of capacitor plates 42, 44 of depth L and covering a substrate surface area having a length A and a breadth which is large compared with the dimension (W+D), capacitance per unit of surface area is:

$$C_a = \frac{k\epsilon_0 L}{W(W+D)} \quad (5)$$

Assuming D≈0.25 μm and L=2.0 μm, then (W+D)≈0.4 μm and $C_a = 2.5 \times 10^{-3}$ pF/μm². As will be seen later, this value is more than twice the maximum capacitance value available from surface-oriented capacitors.

It is preferable to provide a margin of safety with respect to breakdown field strength $E_{br}$ by slightly increasing W to, for example, 0.2 μm. This safety margin reduces field strength $E_{max}$ to approximately $1.5 \times 10^5$ volts/cm. at a reverse bias of approximately 2.5 volts ($V+V_\beta \approx 3$ volts). The corresponding capacitance $C_a \approx 1.6 \times 10^3$ pF/μm², still more than half again as great as that available from surface-oriented capacitors.

In order to satisfy the inequality of equation (4), the substrate doping $N_p$ should be less than approximately $10^{17}$ cm$^{-3}$. This doping concentration sets the approximate outer limits of "near-intrinsic" for silicon. This condition is quite easily satisfied within the requirements of present integrated circuit technology. Ordinarily, the substrate doping concentration is in the range of $10^{12}$ to $10^{15}$, depending on the other devices to be incorporated into the circuit. Moreover, asymmetric p+ —n and p—n+ junctions can function as effective capacitors if they meet the conditions of equation (4).

It should also be noted that the avalanche breakdown field strength $E_{br}$ increases with doping concentrations. Hence, the foregoing computations are rather conservative. For a substrate doping concentration near the upper limit of $10^{17}$, the width W of region 43 could be decreased somewhat or the capacitor could be operated in the 5 volt range. Without further decreasing width W, the corresponding per unit area capacitance $C_a \approx 5 \times 10^{-4}$ pF/μm². Thus, two parallel conductive regions 42, 44 at a spacing W=0.2 μm having a depth L≈3 μm and a surface wise length of 100 μm, would have a capacitance C≈0.15 pF. That capacitance would be voltage independent over a voltage range satisfying the inequality of equation (4). The capacitor of FIG. 4 may now be compared with various semiconductor capacitors oriented parallel to the substrate surface.

Capacitance of Surface-Oriented Semiconductor Capacitors

For an oxide layer of 2.0 μm thick, a typical surface-oriented MOS capacitor provides a maximum capacitance per unit surface area of $1.7 \times 10^{-4}$ pF/μm² when operated in the accumulation mode. When biased to the depletion mode, a depletion layer forms, reducing capacitance. If the oxide layer is reduced in thickness, for example, to 1.0 μm, maximum capacitance increases to about $3.4 \times 10^{-4}$ pF/μm².

A surface-oriented p-n junction diffused or implanted in weakly p-type silicon ($N_a \approx 3 \times 10^{15}$ cm$^{-3}$; resistivity $\rho \approx 5$ ohm-cm) forms a depletion layer of about 1.1 μm when biased such that $(V+V_\beta) \approx 3$ volts. The corresponding capacitance per unit surface area is about $9 \times 10^5$ pF/μm². More strongly doping the substrate, for example, to $N_a \approx 1 \times 10^{17}$ cm$^{-3}$, $\rho \approx 0.2$ ohm-cm, reduces the width of the depletion layer to about 0.2 μm for $(V+V_\beta)=3$ volts. Capacitance per unit surface area correspondingly increases to about $5 \times 10^{-4}$ pF/μm². However, this value is pretty much the limiting case. The field $E_{max} \approx 3 \times 10^5$ volt/cm. across the junction, which approaches the breakdown condition of depleted silicon.

A p+-I-n+ capacitor can be built with its planarity parallel to the substrate surface. Even with the near-intrinsic (I) layer quite thin (W≈0.1 μm) and totally depleted of free carriers, the maximum capacitance per unit surface area would be about $1 \times 10^{-3}$ pF/μm.

Relationship of Diameter to Spacing Between Columns

The foregoing analysis of the capacitor of FIG. 4 suggests that the minimum spacing W' between the opposite polarity columnar conductive regions 12, 14, of FIGS. 1-3 is on the order of 0.15 μm. However, use of a curved geometry in silicon p-n junctions made by conventional integrated circuit techniques is known to concentrate the field potential distribution adjacent the curved surfaces of such junctions. In effect, material adjacent the surface of a curved junction has a lower breakdown field $E_{br}$ than identical material adjacent the surface of a planar junction.

Hence, the minimum spacing between columnar conductive regions of opposite polarity is determined by the locations of maximum field occurring at the minimum radius of curvature of such regions. For circular cylindrical columns, this field can be considered essentially uniform around the column, although this assumption is not necessarily true for all geometric arrangements of opposite polarity columnar regions. Accordingly, the minimum spacing between the columns can be related to their diameter D and their center-to-center spacing R, as shown in FIG. 6.

As mentioned above, FIG. 6 shows a particular topology for a hexagonal array of columns in which the p-doped columns 64 form the vertices of a small hexagonal array while the n-doped columns 62 form the central electrodes of each small hexagon and, collectively, form a large hexagonal array. The p-doped columns outnumber the n-doped columns in a ratio of 2 to 1. Hence, the electric field maxima in such an array occur at the periphery of the n-doped columns 62. Assuming that column length L is larger than both column diameter D and the center-to-center radius R of the columns, the field for a p-I-n capacitor will be roughly similar to that of the cylindrical capacitor model.

In that model, the inner and outer radii of two concentric cylindrical, opposite-polarity conductors are D/2 and (R-D/2), respectively. The equation:

$$C = 2\pi k\epsilon_o L / \ln[(2R-D)/D] \quad (6)$$

sets forth the capacitance of such model and, consequently, for all columns of length L large compared with (R−D/2).

The electric field strength between the inner and outer conductors varies as the inverse of the voltage between them. The maximum electric field strength just outside the inner conductor which carries a charge Q is:

$$E_{max} = Q/\pi\epsilon_0 kLD. \quad (7)$$

The total voltage difference between the inner and outer conductors, which approximates the difference between conductors 62a and 64 in the array of FIG. 6, is given by:

$$V = \frac{Q}{C} = Q \ln\left[\frac{2R-D}{D}\right] / 2\pi\epsilon_0 kL = \quad (8)$$

$$\tfrac{1}{2} D E_{max} \ln\left[\frac{2R-D}{D}\right]$$

The latter relationship of equation 8 permits the maximum electric field $E_{max}$ to be related to voltage V for a given set of dimensions. Preliminarily, it should be noted that $E_{max}$ approaches $E = V/(R-D)$ when (R−D) is much less than D, that is, when the spacing between opposite polarity regions 62a and 64 is much less than their diameters.

For a silicon integrated circuit capacitor 60 operated in a voltage range $V \simeq 3$ volts, maximum electric field strength $E_{max}$ should be assumed to be approximately $2 \times 10^5$ volts/cm. to provide a margin of safety for variations in field concentration about any localities with a smaller radius of curvature than average. Referring to equation 8, these constraints require that:

$$D \ln\left[\frac{2R-D}{D}\right] \geq \frac{2V_{max}}{E_{max}} = 0.3 \ \mu m \quad (9)$$

If the center-to-center spacing R between the opposite polarity columns is assumed to be twice their diameter D, then $\ln[(2R-D)/D] = \ln 3 \simeq 1.1$. Substituting this value in equation (9) establishes a design limit such that the minimum spacing between the columns is twice their minimum diameter, that is, $R_{min} = 2D_{min} \simeq 0.546 \ \mu m$.

By varying the ratio R/D, an optimum ratio of diameter to spacing between the cylinders and the maximum capacitance obtainable per unit area of substrate can be determined for a selected maximum operating voltage V and a given breakdown field $E_{max}$. Table 1 below is an example of such computations for $V_{max} = 3$ volts and $E_{max}$ less than $2 \times 10^5$ volt/cm. Table 1 also includes computations of capacitance per small hexagon of FIG. 6 and capacitance per unit area of substrate, assuming that the length L of the columns is 2 $\mu$m.

Each hexagon in the small hexagonal array of p-type regions 64 occupies a substrate surface area of $3\sqrt{3}L^2/2 \simeq 2.6 \ L^2$. For the entire capacitor of FIG. 6, capacitance $C_a$ per unit area of substrate approximately equals the capacitance for one hexagon, derived from the cylindrical capacitor model, times the packing density of a hexagon. For R/D=2.0, the area of each hexagon is 2.6 $L^2 \simeq 0.776 \ \mu m^2$ and capacitance per hexagon is:

$$C_x = 2\pi k\epsilon_0 L / \ln\left(\frac{2R-D}{D}\right) = 1.16 \times 10^{-3} \ pF. \quad (10)$$

Hence, array capacitance per unit surface area of substrate is:

$$C_a = \frac{4\pi k\epsilon_0 L}{3\sqrt{3} \ R^2} \ln\left(\frac{2R-D}{D}\right) = 1.5 \times 10^{-3} \ pF/\mu m^2. \quad (11)$$

Table 1 demonstrates that for $V_{max} = 3$ volts and $E_{max} > 2 \times 10^5$ volts/cm., the optimum ratio of $R/D \simeq 1.6 + 0.2$, in terms of capacitance yield per unit area. Accordingly, the spacing W' between opposite-polarity columns 62a, 64 is approximately 0.23 $\mu$m. The capacitance yield at such spacing is about $1.7 \times 10^{-3}$ pF/$\mu m^2$. Total capacitance is somewhat less efficient in capacitance yield per unit of substrate surface area than a multiple parallel plate array, such as that of FIG. 4. However, it is at least half again more efficient than surface-oriented capacitors. Moreover, it is amenable to adjustment of total capacitance in steps as small as one femtofarad by link trimming.

TABLE 1

| (R/D) | $\frac{2R-D}{D}$ | $D_{min}$ ($\mu$m) | $R_{min}$ ($\mu$m) | Capacitance per hexagon (pF) | Area per hexagon $3\sqrt{3} \ R^2/2)$ ($\mu$m)$^2$ | Capacitance per unit chip area pF/($\mu$m)$^2$ |
|---|---|---|---|---|---|---|
| 1.2 | 1.4 | 0.892 | 1.070 | $3.80 \times 10^{-3}$ | 2.98 | $1.28 \times 10^{-3}$ |
| 1.4 | 1.8 | 0.510 | 0.715 | $2.18 \times 10^{-3}$ | 1.33 | $1.64 \times 10^{-3}$ |
| 1.6 | 2.2 | 0.380 | 0.609 | $1.62 \times 10^{-3}$ | 0.964 | $1.68 \times 10^{-3}$ |
| 1.8 | 2.6 | 0.314 | 0.565 | $1.34 \times 10^{-3}$ | 0.830 | $1.61 \times 10^{-3}$ |
| 2.0 | 3.0 | 0.273 | 0.546 | $1.16 \times 10^{-3}$ | 0.776 | $1.50 \times 10^{-3}$ |

TABLE 1-continued

| (R/D) | $\frac{2R - D}{D}$ | $D_{min}$ (μm) | $R_{min}$ (μm) | Capacitance per hexagon (pF) | Area per hexagon $3\sqrt{3}\,R^2/2)$ (μm)$^2$ | Capacitance per unit chip area pF/(μm)$^2$ |
|---|---|---|---|---|---|---|
| 2.2 | 3.4 | 0.245 | 0.539 | $1.045 \times 10^{-3}$ | 0.756 | $1.38 \times 10^{-3}$ |
| 2.4 | 3.8 | 0.225 | 0.539 | $9.58 \times 10^{-4}$ | 0.756 | $1.27 \times 10^{-3}$ |
| 2.6 | 4.2 | 0.209 | 0.544 | $8.91 \times 10^{-4}$ | 0.768 | $1.16 \times 10^{-3}$ |
| 2.8 | 4.6 | 0.197 | 0.550 | $8.38 \times 10^{-4}$ | 0.788 | $1.06 \times 10^{-3}$ |

FIG. 6 is drawn to a scale of R=0.61 μm and D=R/1.6. Larger or smaller scale versions of the array of FIG. 6 can be made to the same spatial proportions. However, smaller sizes would require operation at either a lower operational voltage or require use of a semi-insulative material, such as gallium arsenide or indium phosphide, for which a higher field strength is permissible. The latter alternative utilizes a p+-SI-n+ junction structure.

Reverse-Biased P+-SI-N+ Junction

The p+-SI-n+ junction resembles the foregoing p+-I=n+ junction in that separate sets of n+ and p+ conductive regions are required to form the opposite polarity sides of the capacitor. However, rather than a near-intrinsic semiconductor substrate, such as silicon, the substrate is of a semi-insulating (SI) material. Such materials, of which gallium arsenide and indium phosphide are examples, typically have a resistivity $\rho \simeq 10^8$ at 300° K. and a carrier density of, for example, $N_a \simeq 10^7$ cm$^{-3}$. The carrier density and spacings between the oppositely-doped conductive regions can be altered from those of the p+-I-n+ capacitor providing the inequality:

$$\frac{W^2 N_a}{V + V_\beta} << \frac{2k\epsilon_0}{e} \quad (12)$$

is satisfied to deplete the entire semi-insulating region between the conductive regions.

Interconnection of Conductive Regions

As mentioned above, the array of FIG. 6 requires separate sets of surface conductors to the opposite polarity regions. One set of conductors can be omitted by interconnecting the p-doped columns 64 within the substrate to form, in essence, a sea of p-type conductive material 74 isolating n-type conductive columns 72 from one another, as shown in FIG. 7. All that remains to interconnect along the surface of the substrate is the large hexagonal array of n-doped columns 72.

Each of columns 72 is concentrically surrounded by an annular cylinder 76 of near-intrinsic or semi-insulative substrate material. The annular thickness of cylinders 76 is the previously-calculated spacing W' between the opposite polarity regions 12b, 14b of FIG. 6. Similarly, the diameters of columns 72 and their center-to-center spacing are determined for the desired operating voltage range and breakdown field strength of the substrate material in the same manner that such parameters are determined for the capacitor of FIG. 6.

A variety of patterns of interconnections of columns 62, 64 in FIG. 6 and columns 72 in FIG. 7 are possible. In the simplest example, they could be interconnected by straight line conductors much as shown in FIG. 1. More complex patterns are shown in detail in FIGS. 11 and 12 and in more general form in FIGS. 13, 14 and 15.

Figure 11:
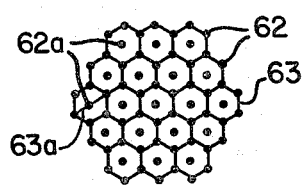
FIG. 11 is a diagram of a link-trimmable honeycomb pattern of conductor interconnections of the positive-polarity conductive columns of FIGS. 6 and 7.

FIG. 11 shows a honeycomb pattern of links 63 which can be used for interconnecting regions 62 of FIG. 6 or regions 72 of FIG. 7. A similar but smaller honeycomb pattern of links (not shown) electrically insulated from links 63 can be used to interconnect regions 64 on either the same or the opposite surface of the substrate as is occupied by links 63. This pattern of interconnections is highly redundant, and therefore fault resistant. The basic hexagonal pattern of FIG. 11 bypasses regions 62a. However, to increase capacitance, cross links 63a can be provided during fabrication to electrically connect regions 62a to regions 62. Conversely, to reduce capacitance, some of links 63, 63a can be cut, using conventional resistance-trimming techniques, to electrically isolate the desired number of regions 62, 62a from the capacitor. Link trimming can be performed after fabrication of the circuit, which is particularly advantageous in tuning analog integrated circuits.

Figure 12:
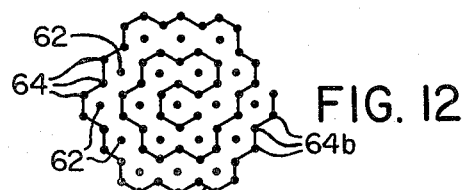
FIGS. 12 and 13 are somewhat less redundant variations of the hexagonal interconnection pattern of FIG. 11, FIG. 12 showing a spiral and FIG. 12 a concentric circle pattern.
Figure 13:
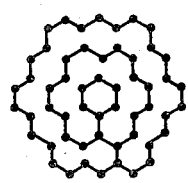

Numerous variations of the honeycomb pattern are possible. FIGS. 12 and 13 show somewhat less redundant forms of hexagon-based linkage patterns forming a spiral and a series of interconnected concentric rings. In FIG. 12, columns 64 are interconnected by the spiral pattern of links. Columns 62 are interconnected by a separate pattern of links not shown for purposes of clarity. The latter pattern could, for example, be another spiral. Although the links of FIGS. 12 and 13 are shown in a hexagonal pattern, a somewhat broadened conductor (not shown), encompassing the envelope of such links but spaced apart from a similar such conductor in inwardly and outwardly adjacent rings or spiral loops, can be used without reducing link trimmability.

Figure 14:
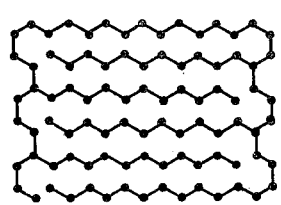
FIGS. 14 and 15 are diagrams of generally linear link-trimmable interconnections of the positive-polarity columns of FIGS. 6 and 7.
Figure 15:
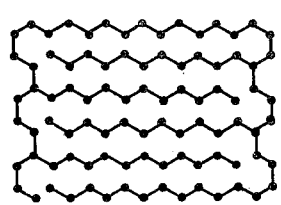

FIGS. 14 and 15 show two generally rectangular forms of interconnection patterns. Both patterns provide for interleaved rows of surface links which are somewhat less redundant than the pattern of FIG. 11.

Figure 9:
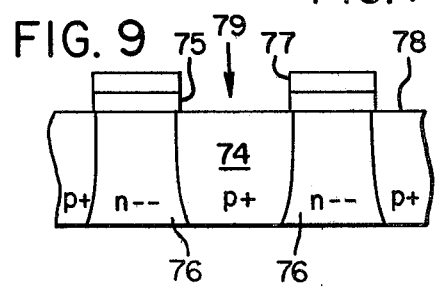
FIGS. 9, 9a and 9b are cross-sectional views taken along line 9—9 in FIG. 7 showing two steps in the process of making the capacitor of FIG. 7.
Figure 9A:
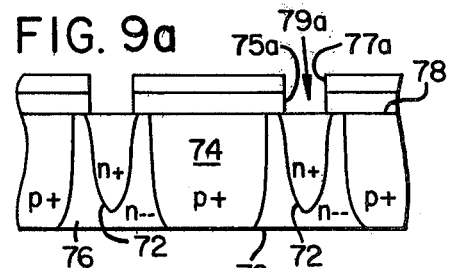
Figure 9B:
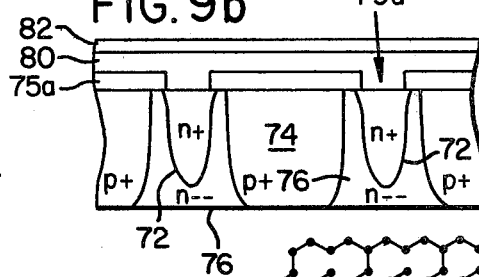

Referring to FIG. 9b, conductive regions 72 can also be interconnected by a contiguous planar sheet of conductor 80 extending over the entire surface area of the capacitor of FIG. 7. Conductor 80 is isolated from region 84 by an oxide layer 75a. Openings 79a in the oxide layer admit portions of conductor 80 into contact with conductive regions 72. A silicon dioxide or other insulative layer 82 covers the entire sheet. Although not link trimmable in the conventional sense, as described above, capacitance can still be decreased by trimming portions of the conductor 80 to isolate a desired number of regions 82 from the capacitor. It is also possible to selectively destroy the conductive capacity of that portion of conductor 80 extending into opening 79a to electrically disconnect a selected region 72 from the rest of capacitor 70. An additional advantage of this manner of interconnecting columns 72 is that some additional capacitance is gained between the conductor 80 and conductive region 74 across oxide layer 75a.

METHOD OF FABRICATION

In general, the same series of steps can be utilized in fabricating any of the capacitors of FIGS. 1-7.

First, a substrate of suitable semiconductor or semi-insulative material is prepared. Preparation includes providing a flat reference surface. If the material is monocrystalline, the reference surface is oriented to provide an open crystallographic channel extending downwardly into the bulk of the substrate.

Figure 8:
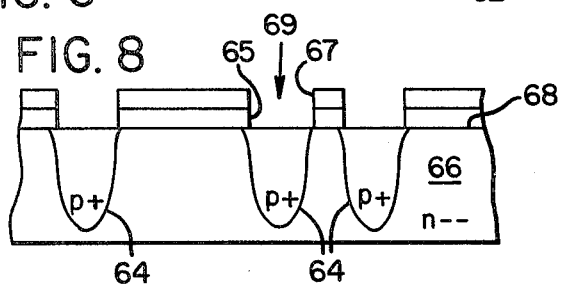
FIGS. 8 and 8a are cross-sectional views taken along line 8—8 in FIG. 6 showing two steps in the process of making the capacitor of FIG. 6.
Figure 10:
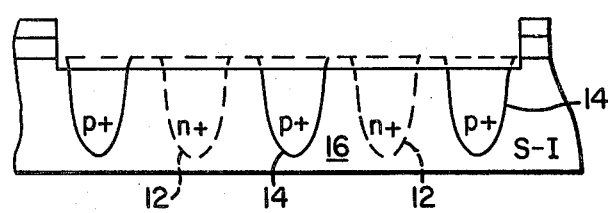
FIG. 10 is a cross-sectional view corresponding to FIG. 8a showing a step of a process for making capacitors in accordance with the invention in semi-insulative material.

Second, referring to FIGS. 8 and 9, one type dopant is selectively implanted deeply into the bulk of the substrate to form one set of conductive regions, for example, regions 64, 74. Multiple energy dose implants are used to obtain a substantially uniform carrier concentration profile along the depthwise extent of the regions. The aforementioned open crystallographic channel can be used to maximize penetration of the dopant. The maximum depth of implantation of the regions can be controlled to determine capacitance values during fabrication.

Figure 8A:
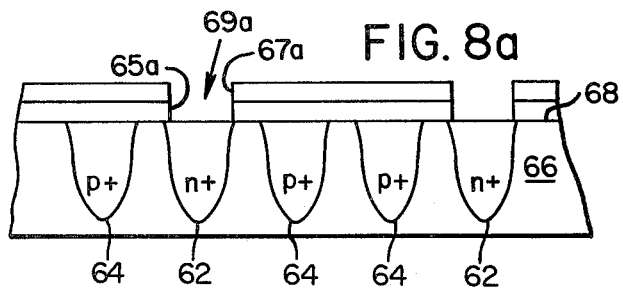

Third, referring to FIGS. 8a and 9a, the second set of conductive regions are formed, for example, regions 62, 72.

Finally, one set of regions are electrically interconnected along the substrate surface. The other set is similarly interconnected unless it is interconnected within the substrate as shown in FIG. 9b.

Optionally, the substrate can be annealed to cure lattice defects caused by heavy implantation of the conductive regions. This step can be performed either before or after applying the surface interconnections, depending on whether or not the interconnections also need annealing. If annealing is used, care must be taken to avoid undue diffusion of the implanted ions. Hence, annealing temperatures should not exceed about 900° C.

The foregoing steps can be varied or embellished as will become more readily apparent from the following examples.

FIG. 8 Embodiment of Method

FIG. 8 shows a silicon substrate or wafer 66 lightly n-doped to a concentration $N_d \approx 10^{15} < 10^{17}$ cm$^{-3}$ (or p-doped to a concentration of comparable resistivity, if preferred for other devices in the circuit). This wafer has been cut so that a selected open channel, for example, the <110> axis is approximately normal to reference surface 68. In the step illustrated in FIG. 8, the substrate has been provided, either by deposition or thermal growth, with an oxide layer 65. The oxide layer has been masked with a suitable photoresistant layer 67. The masks are designed using conventional masking techniques to employ the geometry selected for the capacitor 60 of FIG. 6. Thus, the mask used in the step of FIG. 8 would have, in the position of capacitor 60, a pattern of dots (or "openings," depending on the type of photoresist used) corresponding to the position of the conductive regions 64 shown in FIG. 6.

Following masking and exposure of the photoresist, the oxide layer 65 is etched in accordance with conventional techniques to produce openings 69. Then, the substrate is placed in an ion-implanting apparatus and oriented with the selected open channel substantially aligned with the direction of implantation of ions as discussed further hereinafter. Next, the substrate is exposed to a flux of p-type ions, for example, boron, for a sufficient period of time and in sufficient concentration and energies that the ions will penetrate deeply and substantially uniformly into the substrate, following the open <110> axis of the crystalline lattice. For a given angle of incidence, the depth of penetration and, thus, the depthwise extent of the conductive regions 64, is determined principally by the energies imparted in the dopant ions. A substantially uniform concentration profile along the depthwise extent of the regions is obtained by successive ion implants at increasing energies. Details of multiple-dose-energy implanting are set forth in the aforementioned text by Carter, et al. at pages 190 and 197.

Next, the substrate is prepared for formation of conductive regions 62. Oxide and photoresist layers 65, 67 are removed and new oxide and photoresist layers 65a, 67a are applied. The photoresist layer is masked and exposed using a mask including a pattern of dots or "openings" corresponding to the positions of regions 62 shown in FIG. 6.

The oxide layer 67a is then etched to produce openings 69a. Next, the substrate is exposed to a flux of n-type ions, for example, phosphorous. The techniques described above for implanting columns 64 also apply to columns 62.

Now the capacitor is ready for application of the surface conductors. First, photoresist layer 67a is removed. Then, a layer of heavily-doped polysilicon is applied and etched to the linkage pattern of, for example, FIG. 11, interconnecting columns 62. Next, another oxide layer (not shown) is applied over the linkage pattern and layer 65a. Both oxide layers are again masked and etched as shown in FIG. 8. A second polysilicon layer is applied to the surface of the oxide and etched to the linkage pattern of, for example, FIG. 12, interconnecting columns 64. Then, another oxide layer is applied to protect the surface of the capacitor. This step completes fabrication of capacitor 60.

The capacitance value of capacitor 60 can be reduced, for example, during quality control testing, to tune the circuit of which it forms a part. Referring to FIG. 12, to reduce capacitance a link 63b is cut to electrically isolate columns 64b. Additional reductions in capacitance are made in the same way.

FIG. 9 Embodiment of Method

FIG. 9 shows a lightly n-doped substrate 76 similar to substrate 66. First, the substrate is oxidized, masked and etched so as to leave discs of oxide 75 and photoresist 77. P-type ions are implanted through the exposed surface openings 79 to form a contiguous conductive region 74. The oxide discs shield relatively large, for example, about 0.84 μm, diameter columns 76 of the substrate material from the ions.

Next, the oxide and photoresist discs 75, 77 are removed. Oxide and photoresist layers 75a, 77a are then applied. The layers are masked and etched in accordance with the pattern of columns 72 to form circular openings 79a concentric with columns 76. N-type ions are implanted through these openings to form conductive columns 72 of, for example, 0.38 μm diameter, inside columns 76.

Referring to FIG. 9b, the photoresist layer 77a is removed and a heavily-doped polysilicon conductor layer 80 is applied. If desired, layer 80 is etched to one of the linkage patterns of FIGS. 11-15, followed by application of a protective oxide layer 82. Alternatively, layer 80 can be left unetched as a contiguous conductive sheet covered by oxide layer 82.

Deep Ion Implantation

The depth of ion implantation is maximized or otherwise controlled to determine the depthwise dimensions of the conductive regions, in two ways. The first way is by manipulation of implantation energies to determine the depth of ion penetration. This technique is described in the aforementioned article by Lee, et al. and need not be discussed further herein except to note that no one has previously put it to use in forming depthwise-extending capacitor conductors.

The second way to control implantation depth, particularly in monocrystalline substrates is to use channeling. The basic techniques of channeling as described by Lee, et al. should be modified in several respects to perform the present invention.

First, it should be noted that the Figures show the conductive regions extending downwardly into the substrate nonmal to the reference surface. They need not be normal to such surface. If desired, the substrate could be cut with a desired open crystallographic channel at an angle, for example 0.8°, from the normal to the reference surface.

Cutting a substrate in this manner assists in forming the various surface-oriented elements of an integrated circuit. Such elements are implanted with the substrate lying flat in the implanting apparatus.

The ion flux is normal to the reference surface and, hence, misaligned by 0.8° with the channel. As a result, implant penetration is sharply limited, for example, to less than 1.0 μm. V. G. K. Reddi, et al., in "Channeling and Dechanneling of Ion-Implanted Phosphorus in Silicon," J. Appl. Phys., Vol. 44, No. 7, pp. 2951-2963, July, 1973, discuss the desirability and details of dechanneling in this way.

To implant the conductive regions forming the capacitor along such channel, the substrate is then tilted by such angle to substantially align the channel with the ion flux. As a result, ion penetration is maximized to obtain conductive regions of 2.0 μm or more in depth.

Second, the choice of crystallographic channel selected for implanting the conductive regions of the capacitor will influence both the maximum depth and the depthwise carrier concentration profile of such regions. For example, a simple implant of ions along the <110> direction in silicon will yield greater penetration than an implant of the same ions at the same energies along the <100>, <111> and <112> directions. However, the resultant depthwise carrier concentration profile in the <110> direction is much less uniform than the profiles along the other directions. Accordingly, if the conductive regions are implanted in the <110> direction, multiple energy-dose implants are required to obtain a substantially uniform composite depthwise concentration profile.

Third, ion penetration depth varies substantially with relatively small deviations of ion flux direction from channel direction. This variation is also nonlinear. Consequently, a deviation of about 0.3° from a selected channel makes little difference in either depth of ion penetration or the carrier-concentration profile resulting from a single implant. However, for a deviation of about 0.6° or more, the difference becomes very large. Maximum attainable depth of the conductive regions is reduced because their carrier concentrations at their lower ends quickly decrease below the concentrations necessary to establish a conductive boundary condition. At a channel deviation less than about 0.3°, the maximum attainable depth of the conductive boundary condition is three to four times the depth attainable at 0.9°.

The effects of angular deviation can be mitigated to some extent by increasing ion doses and implantation energies and by selecting a channel having lesser sensitivity to angular deviation, such as the <111> orientation. Using these techniques, a tilt or deviation angle up to about 0.5° is permissible. Nevertheless, tight angular control of implantation direction remains important.

Consequently, the geometrical relationship of the substrate and the implant apparatus must be considered. Viewing the implanting apparatus as essentially a point source of ions, the substrate must be spaced far enough away from the source that angular deviation of ion direction from the selection channel is less than 0.3° to 0.5° everywhere on the substrate. In other words, the arcsine of the ratio of the radius of the substrate over the distance between the source and center of the substrate should be less than 0.3° to 0.5°. At the substrate's center, the channel orientation and ion flux are aligned. Near its periphery, the deviation is less than 0.3° to 0.5°. Accordingly, in all of the chips in a single wafer, the conductive regions will have substantially uniform depth. Resultant capacitance values are likewise uniform, for example, within a variation of ±15 to 20%. If greater capacitor-value precision is required, the aforementioned link-trimming capability can be used to reduce the range of variation to within about one femtofarad of ideal.

Having illustrated and described several embodiments of the invention, it should be apparent to those skilled in the art that the invention may be modified in arrangement and detail. We claim as our invention all such modifications as come within the spirit and scope of the following claims.

We claim:

1. A method of making a capacitor in a solid body of substantially nonconducting material having a reference surface, comprising:

injecting conductive material through said surface depthwise into said body at two separate but closely-spaced positions along said surface to form two narrow conductive regions extending downwardly a distance into said material; and forming two electrically isolated conductors along said surface including a first conductor connected to a first one of said conductive regions and a second conductor connected to a second one of said regions;

said two regions being electrically isolated within said nonconducting material such that, in operation, electrical charge is stored in the regions and current flow is substantially limited to changes in the amounts of charge stored in said regions.

2. A method of making a capacitor in a solid body of substantially nonconducting material having a reference surface, comprising:

injecting conductive material through said surface depthwise into said body at two separate but closely-spaced positions along said surface to form two electrically-isolated narrow conductive regions extending downwardly a distance into said material; and forming two electrically isolated conductors along said surface including a first conductor connected to a first one of said conductive regions and a second conductor connected to a second one of said regions;

the injecting step including injecting material into said surface at multiple closely spaced-apart positions to form multiple of said first and second conductive regions; the second regions being electrically interconnected within the body of the nonconducting material.

3. A method of making a capacitor in a solid body of substantially nonconducting material having a reference surface, comprising:

injecting conductive material through said surface depthwise into said body at two separate but closely-spaced positions along said surface to form two electrically-isolated narrow conductive regions extending downwardly a distance into said material;

forming two electrically isolated conductors along said surface including a first conductor connected to a first one of said conductive regions and a second conductor connected to a second one of said regions;

shaping said regions to form, in effect, parallel plates extending downwardly into the nonconducting material.

4. A method of making a capacitor in a solid body of substantially nonconducting material having a reference surface, comprising:

injecting conductive material through said surface depthwise into said body at two separate but closely-spaced positions along said surface to form two electrically-isolated narrow conductive regions extending downwardly a distance into said material;

forming two electrically isolated conductors along said surface including a first conductor connected to a first one of said conductive regions and a second conductor connected to a second one of said regions; and shaping said regions to form substantially parallel spikes extending downwardly into the nonconducting material.

5. A method according to claim 4 in which forming said parallel spikes comprises forming a plurality of first spikes defining said first conductive region and forming a plurality of second spikes defining said second region, the injecting step including interspersing said second spikes among the first spikes in spaced relationship.

6. A method of making a capacitor in a solid body of substantially nonconducting material having a reference surface, comprising:

injecting conductive material through said surface depthwise into said body at two separate but closely-spaced positions along said surface to form two electrically-isolated narrow conductive regions extending downwardly a distance into said material; and forming two electrically isolated conductors along said surface including a first conductor connected to a first one of said conductive regions and a second conductor connected to a second one of said regions;

said nonconducting material being one of a semi-insulating substrate and a semiconducting substrate and the injecting step comprising implanting sufficient dopant ions into the substrate to establish metal-like conductive boundary conditions defining said regions.

7. A method according to claim 6 in which the substrate has an open crystallographic channel extending into the substrate from said surface and the injecting step includes aligning an ion beam substantially parallel to said channel so as to inject the ions to a maximum depth.

8. A method according to claim 6 in which the injecting step includes implanting p-type ions to form the first region and n-type ions to form the second region, said regions being spaced closely enough together to totally deplete the intervening substrate material of free carriers during operation of the capacitor.

9. A method according to claim 6 in which the step of implanting dopant ions to form said first and second conductive regions includes forming said regions to a depth greater than the narrowest surface-wise dimension of said conductive regions.

10. A method according to claim 5 in which the interspersing step includes arranging said first and second spikes in accordance with a regular geometric pattern such that each of said first spikes is approximately identically surrounded by said second spikes.

11. A method according to claim 10 in which the first spikes are arranged in a rectangular pattern.

12. A method according to claim 10 in which the first spikes are arranged in a hexagonal pattern.

13. A method according to claim 9 including spacing said first and second conductive regions a distance W apart so that such regions are electrically separated by a thickness of said nonconducting region great enough that the breakdown voltage of the thickness is not exceeded but close enough that said thickness is entirely depleted of free carriers during operation of the capacitor.

14. A method according to claim 13 in which the nonconducting region has a width W and an excess carrier concentration N such that $$N < 2k\epsilon_o(V+V_\beta)/eW^2$$

where
$V+V_\beta$ is the voltage between the conductive regions;
k is the dielectric constant;
$\epsilon_o$ is the permittivity of free space; and
e is the electronic charge.

15. A method according to claim 14 in which the conductive regions comprise at least a pair of oppositely-doped, parallel plates each having a thickness D, and a depth $L > (W+D)$.

16. A method according to claim 9 in which the first conductive region comprises an array of conductive spikes each having a diameter D, a minimum center-to-center spacing R and a length $L > R$; the diameter D and spacing R having minimum values satisfying the inequality $$D \ln\left[\frac{2R-D}{D}\right] \geq \frac{2V_{max}}{E_{max}},$$

$V_{max}$ being the maximum voltage to be applied to the capacitor; and
$E_{max}$ being the maximum electric field strength the material forming the nonconducting region can withstand.

17. A method according to claim 16 in which the second conductive region comprises a contiguous, oppositely-doped region surrounding the spikes of the first conductive region.

18. A method of forming a capacitor in an integrated circuit comprising:

- selecting a semiconductor substrate having a reference surface and an open crystallographic channel extending into the substrate from said surface;
- ion implanting two groups of column-like conductive regions into said substrate in a direction aligned with said crystallographic channel so as to maximize the depth of said conductive regions, a first group being formed by implanting p-type ions, a second group being formed by implanting n-type ions;
- positioning said conductive regions in a regular geometric pattern such that each conductive region of one group is surrounded by at least three conductive regions of the other group spaced apart an equal distance therefrom and spaced angularly equidistantly apart from one another; and
- forming first and second conductors extending parallel to said surface to interconnect alternate ones of said conductive regions such that each conductive region of the first group is connected to the first conductor and has as its closest neighbors at least three conductive regions of the second group connected to said second conductor;
- at least one of said first and second conductors being formed so that they can be trimmed to determine the number of conductive regions electrically connected thereto.

* * * * *